United States Patent
He et al.

(10) Patent No.: US 10,978,556 B2
(45) Date of Patent: Apr. 13, 2021

(54) SEMICONDUCTOR DEVICE AND METHOD FOR FABRICATING THE SAME

(71) Applicant: UNITED MICROELECTRONICS CORP., Hsin-Chu (TW)

(72) Inventors: Wanxun He, Singapore (SG); Su Xing, Singapore (SG)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 46 days.

(21) Appl. No.: 16/280,047

(22) Filed: Feb. 20, 2019

(65) Prior Publication Data

US 2019/0189738 A1 Jun. 20, 2019

Related U.S. Application Data

(62) Division of application No. 15/365,954, filed on Dec. 1, 2016, now Pat. No. 10,256,297.

(30) Foreign Application Priority Data

Nov. 3, 2016 (CN) .......................... 201610957169.5

(51) Int. Cl.
| | |
|---|---|
| H01L 29/06 | (2006.01) |
| H01L 29/78 | (2006.01) |
| H01L 29/165 | (2006.01) |
| H01L 21/28 | (2006.01) |
| H01L 21/285 | (2006.01) |
| H01L 21/768 | (2006.01) |
| H01L 29/08 | (2006.01) |

(Continued)

(52) U.S. Cl.
CPC .... *H01L 29/0649* (2013.01); *H01L 21/28088* (2013.01); *H01L 21/28518* (2013.01); *H01L 21/76805* (2013.01); *H01L 21/76895* (2013.01); *H01L 29/0847* (2013.01); *H01L 29/161* (2013.01); *H01L 29/165* (2013.01); *H01L 29/1608* (2013.01); *H01L 29/24* (2013.01); *H01L 29/45* (2013.01); *H01L 29/6656* (2013.01); *H01L 29/66636* (2013.01); *H01L 29/66651* (2013.01); *H01L 29/7834* (2013.01); *H01L 29/7848* (2013.01); *H01L 29/1054* (2013.01); *H01L 29/4966* (2013.01); *H01L 29/517* (2013.01); *H01L 29/6659* (2013.01); *H01L 29/66545* (2013.01)

(58) Field of Classification Search
None
See application file for complete search history.

(56) References Cited

U.S. PATENT DOCUMENTS

| | | |
|---|---|---|
| 7,531,437 B2 | 5/2009 | Brask et al. |
| 9,034,701 B2 | 5/2015 | Cheng et al. |

(Continued)

*Primary Examiner* — Moazzam Hossain
*Assistant Examiner* — Stanetta D Isaac
(74) *Attorney, Agent, or Firm* — Winston Hsu

(57) ABSTRACT

A method for fabricating semiconductor device includes the steps of first providing a substrate, forming a gate structure on the substrate, forming a hard mask on the substrate and the gate structure, patterning the hard mask to form trenches exposing part of the substrate, and forming raised epitaxial layers in the trenches. Preferably, the gate structure is extended along a first direction on the substrate and the raised epitaxial layers are elongated along a second direction adjacent to two sides of the gate structure.

10 Claims, 11 Drawing Sheets

(51) Int. Cl.
*H01L 29/16* (2006.01)
*H01L 29/161* (2006.01)
*H01L 29/24* (2006.01)
*H01L 29/45* (2006.01)
*H01L 29/66* (2006.01)
*H01L 29/51* (2006.01)
*H01L 29/10* (2006.01)
*H01L 29/49* (2006.01)

(56) References Cited

U.S. PATENT DOCUMENTS

| | | |
|---|---|---|
| 2013/0187229 A1 | 7/2013 | Cheng |
| 2014/0273397 A1* | 9/2014 | Rodder ............. H01L 29/41791 |
| | | 438/400 |
| 2015/0061010 A1 | 3/2015 | Cheng |
| 2015/0340468 A1* | 11/2015 | Lim .................. H01L 29/66795 |
| | | 438/283 |
| 2016/0104706 A1 | 4/2016 | Xu |
| 2016/0111537 A1 | 4/2016 | Tsai |
| 2016/0225761 A1 | 8/2016 | Huang |
| 2016/0268434 A1* | 9/2016 | Ching ................. H01L 29/7851 |

* cited by examiner

US 10,978,556 B2

SEMICONDUCTOR DEVICE AND METHOD FOR FABRICATING THE SAME

CROSS REFERENCE TO RELATED APPLICATIONS

This application is a division of U.S. application Ser. No. 15/365,954 filed Dec. 1, 2016, and incorporated herein by reference in its entirety.

BACKGROUND OF THE INVENTION

1. Field of the Invention

The invention relates to a method for fabricating semiconductor device, and more particularly, to a method of forming patterned hard mask on a substrate and gate structure and then forming a raised epitaxial layer on the exposed substrate surface.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

However, current approach of using epitaxial growth process to form epitaxial layer is still insufficient in reaching a balance for overall resistance of the device as well as preventing short channel effect. Hence, how to improve the current fabrication to resolve this issue has become an important task in this field.

SUMMARY OF THE INVENTION

According to a preferred embodiment of the present invention, a method for fabricating semiconductor device includes the steps of first providing a substrate, forming a gate structure on the substrate, forming a hard mask on the substrate and the gate structure, patterning the hard mask to form trenches exposing part of the substrate, and forming raised epitaxial layers in the trenches. Preferably, the gate structure is extended along a first direction on the substrate and the raised epitaxial layers are elongated along a second direction adjacent to two sides of the gate structure.

According to another aspect of the present invention, a semiconductor device is disclosed. The semiconductor device includes: a gate structure extending along a first direction on a substrate; and a plurality of raised epitaxial layers extending along a second direction on the substrate and adjacent to two sides of the gate structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
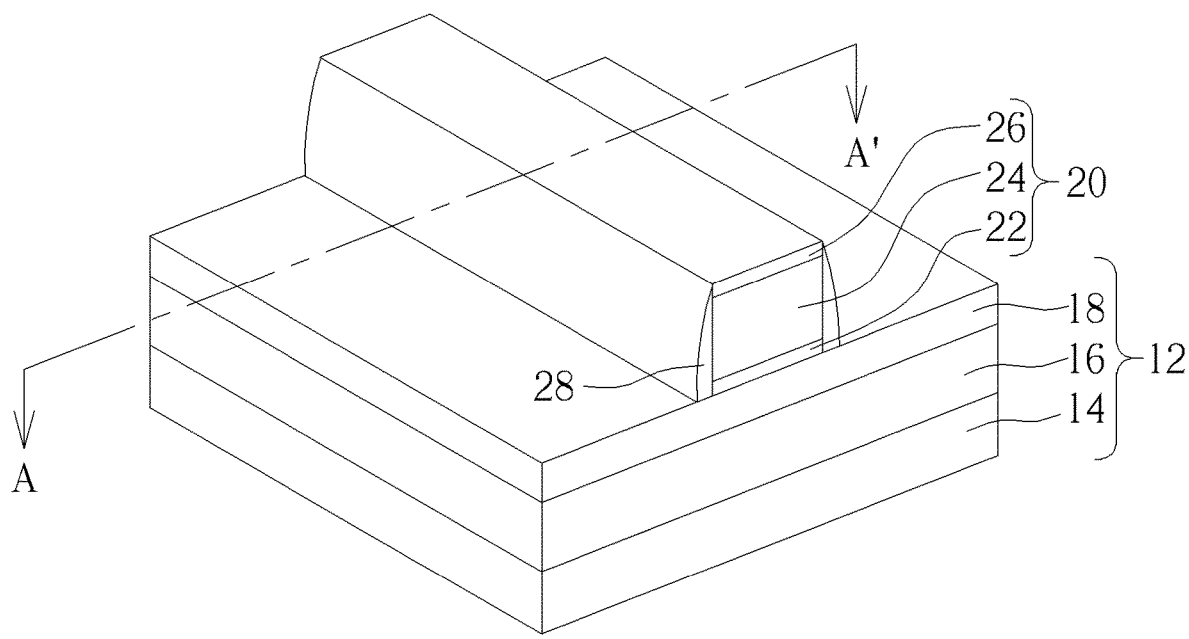
FIG. 1 illustrates a 3-dimensional view for fabricating a semiconductor device according to a preferred embodiment of the present invention.
Figure 2:
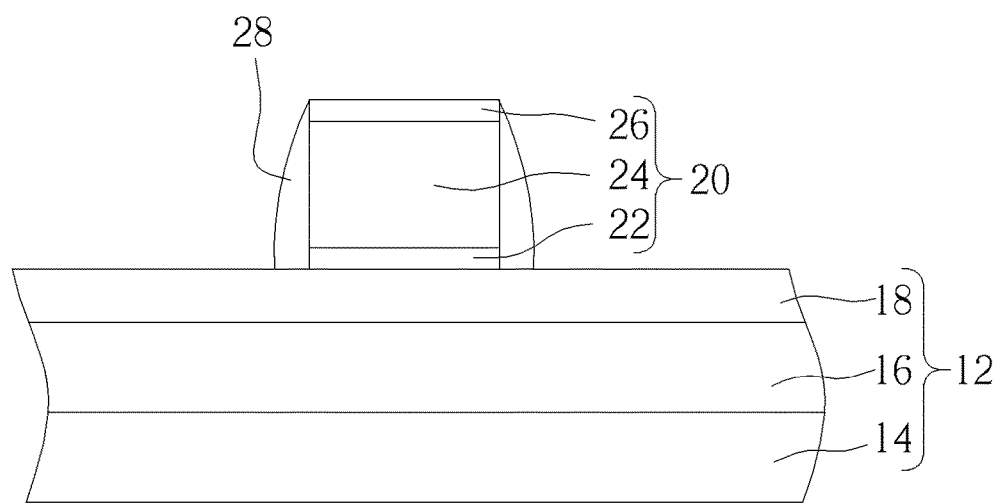
FIG. 2 illustrates a cross-section view of FIG. 1 along the sectional line AA'.

Referring to FIGS. 1-12, FIGS. 1-12 illustrate a method for fabricating semiconductor device according to a preferred embodiment of the present invention. First, referring to FIGS. 1-2, in which FIG. 1 illustrates a 3-dimensional view for fabricating a semiconductor device according to a preferred embodiment of the present invention and FIG. 2 illustrates a cross-section view of FIG. 1 along the sectional line AA'. As shown in FIGS. 1-2, a substrate 12 is provided and an active region is preferably defined on the substrate 12.

In this embodiment, the substrate 12 is preferably a silicon-on-insulator (SOI) substrate, in which the substrate 12 includes a first semiconductor layer 14, an insulating layer 16 on the first semiconductor layer 14, and a second semiconductor layer 18 on the insulating layer 16. Specifically, the first semiconductor layer 14 and second semiconductor layer 18 could be made of same material or different material, in which each of the first semiconductor layer 14 and second semiconductor layer 18 could be selected from the group consisting of silicon, germanium, and silicon germanium (SiGe). The insulating layer 16 disposed between the first semiconductor layer 14 and second semiconductor layer 18 is preferably made of silicon dioxide, but not limited thereto. It should be noted that even though the substrate 12 of this embodiment pertains to a SOI substrate, it would be also desirable to use other semiconductor substrates such as silicon substrate, epitaxial substrate, or silicon carbide substrate as the substrate 12, which is also within the scope of the present invention.

Next, a gate structure 20 is formed on the substrate 12. In this embodiment, the formation of the gate structure 20 could be accomplished by sequentially forming a gate dielectric layer 22, a gate material layer 24, and a hard mask 26 on the substrate 12, performing a pattern transfer process by using a patterned resist (not shown) as mask to remove part of the hard mask 26, part of the gate material layer 24, and part of the gate dielectric layer 22 through single or multiple etching processes, and then stripping the patterned resist to form a gate structure 20 on the active region. The gate structure 20 preferably includes a patterned dielectric layer 22, a patterned gate material layer 24, and a patterned hard mask 26. In this embodiment, the gate dielectric layer 22 could include silicon dioxide, silicon nitride (SiN), or high-k dielectric material, the gate material layer 24 could include conductive material such as metal, polysilicon, or silicides, and the hard mask 26 could be selected from the group consisting of $SiO_2$, SiN, silicon carbide (SiC), and silicon oxynitride (SiON).

Next, at least a first spacer 28, such as an offset spacer is formed on the sidewalls of the gate structure 20. In this embodiment, the first spacer 20 is a single spacer, which could be selected from the group consisting of $SiO_2$, SiN, SiON, and SiCN, but not limited thereto. Nevertheless, according to other embodiments of the present invention, the first spacer 28 could also be a composite spacer depending on the demand of the product. For instance, the first spacer 28 could further include a first sub-spacer (not shown) and a second sub-spacer (not shown), in which a cross-section of either one of the first sub-spacer or the second sub-spacer could be L-shaped or I-shaped, the first sub-spacer and the second sub-spacer could be made of same material or different material, and either one of the first sub-spacer or the second sub-spacer could be selected from the group consisting of $SiO_2$, SiN, SiON, and SiCN. The following embodiment is illustrated with the first spacer 28 being a single spacer.

Figure 3:
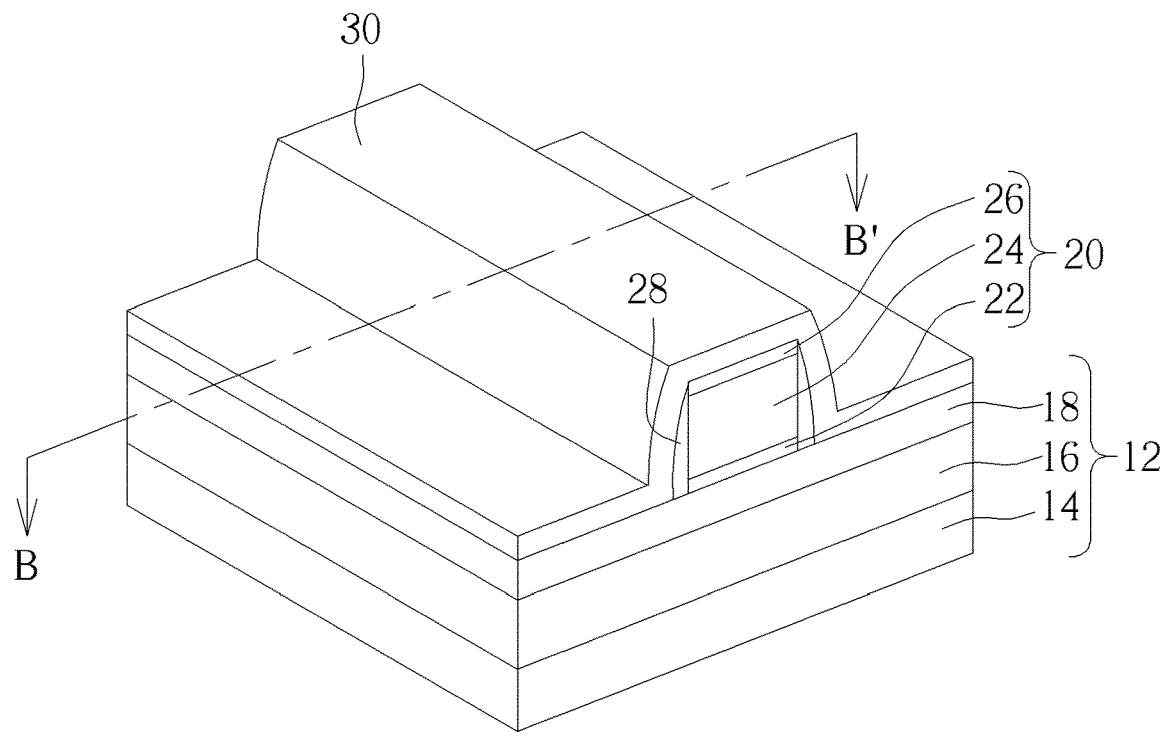
FIG. 3 illustrates a 3-dimensional view for fabricating the semiconductor device following FIG. 1.
Figure 4:
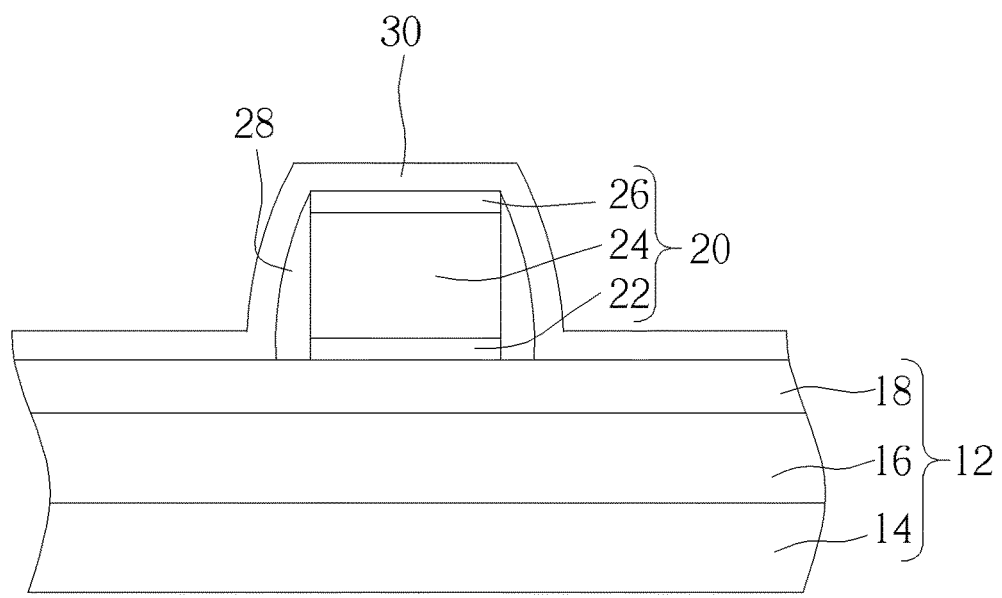
FIG. 4 illustrates a cross-section view of FIG. 3 along the sectional line BB'.

Next, referring to FIGS. 3-4, FIG. 3 illustrates a 3-dimensional view for fabricating the semiconductor device following FIG. 1 and FIG. 4 illustrates a cross-section view of FIG. 3 along the sectional line BB'. As shown in FIGS. 3-4, a hard mask 30 is formed on the substrate 12 and the gate structure 20, in which the hard mask 30 preferably contacts the surface of the second semiconductor layer 18, the top surface of the gate structure 20, and the surface of the first spacer 28. In this embodiment, the hard mask 30 is made of dielectric material including but not limited to for example $SiO_2$, SiN, SiON, SiCN, or combination thereof.

Figure 5:
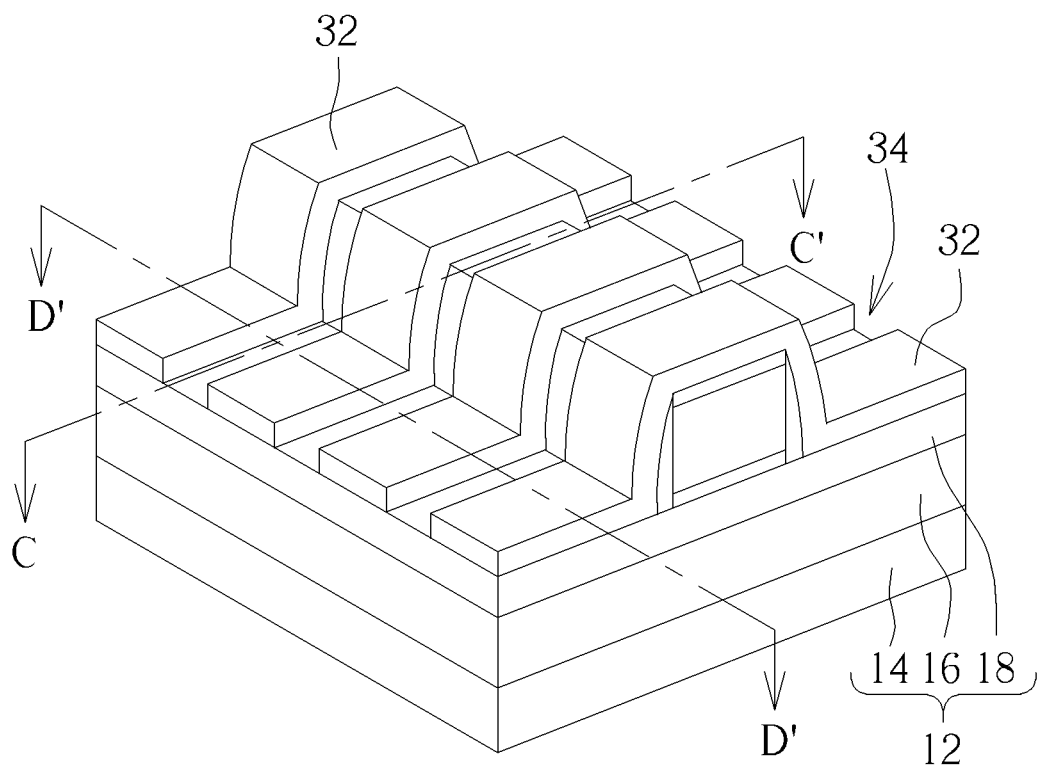
FIG. 5 illustrates a 3-dimensional view for fabricating the semiconductor device following FIG. 3.
Figure 6:
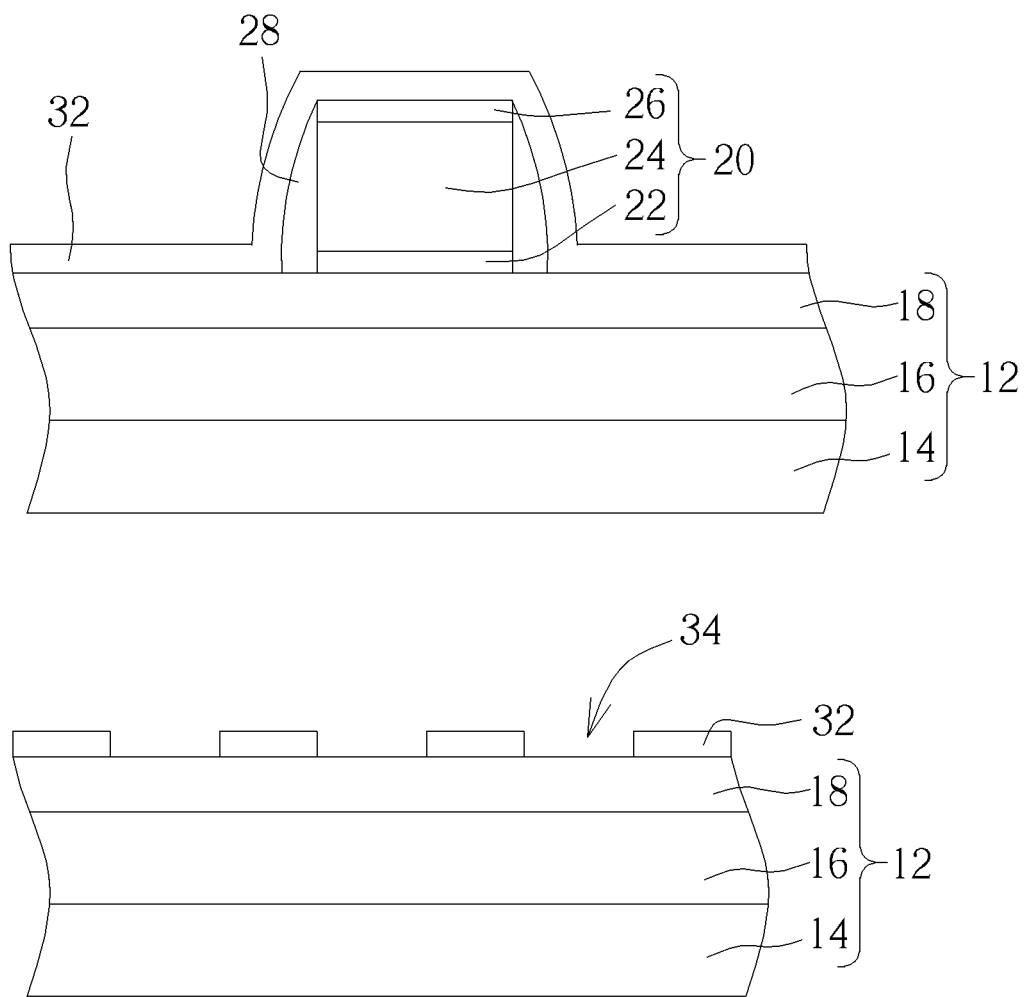
FIG. 6 illustrates cross-section views of FIG. 5 along the sectional line CC' and sectional line DD'.

Next, referring to FIGS. 5-6, FIG. 5 illustrates a 3-dimensional view for fabricating the semiconductor device following FIG. 3, the top portion of FIG. 6 illustrates a cross-section view of FIG. 5 along the sectional line CC', and the bottom portion of FIG. 6 illustrates a cross-section view of FIG. 5 along the sectional line DD'. As shown in FIGS. 5-6, a pattern transfer process is conducted on the hard mask 30 by first forming a patterned resist (not shown) on the hard mask 30, and then using the patterned resist as mask to remove part of the hard mask 30 for forming a patterned hard mask 32 and at the same timing forming a plurality of trenches 34 exposing part of the surface of second semiconductor layer 18.

Figure 7:
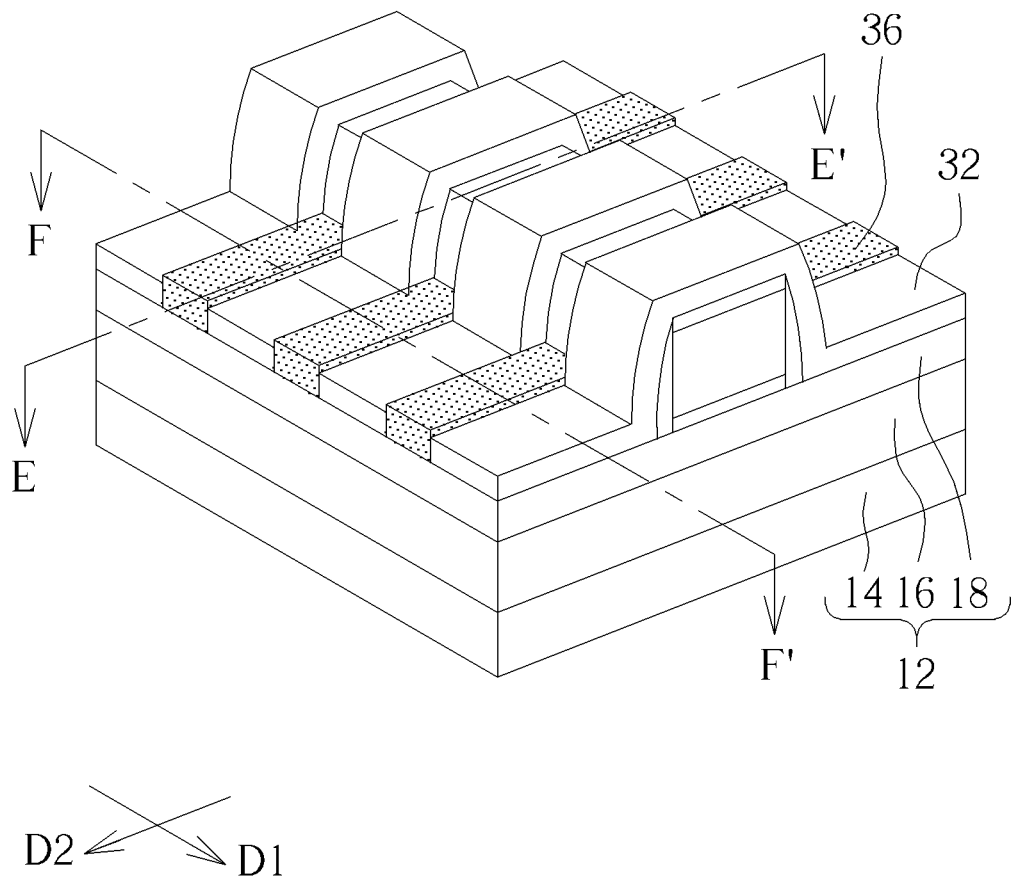
FIG. 7 illustrates a 3-dimensional view for fabricating the semiconductor device following FIG. 5.
Figure 8:
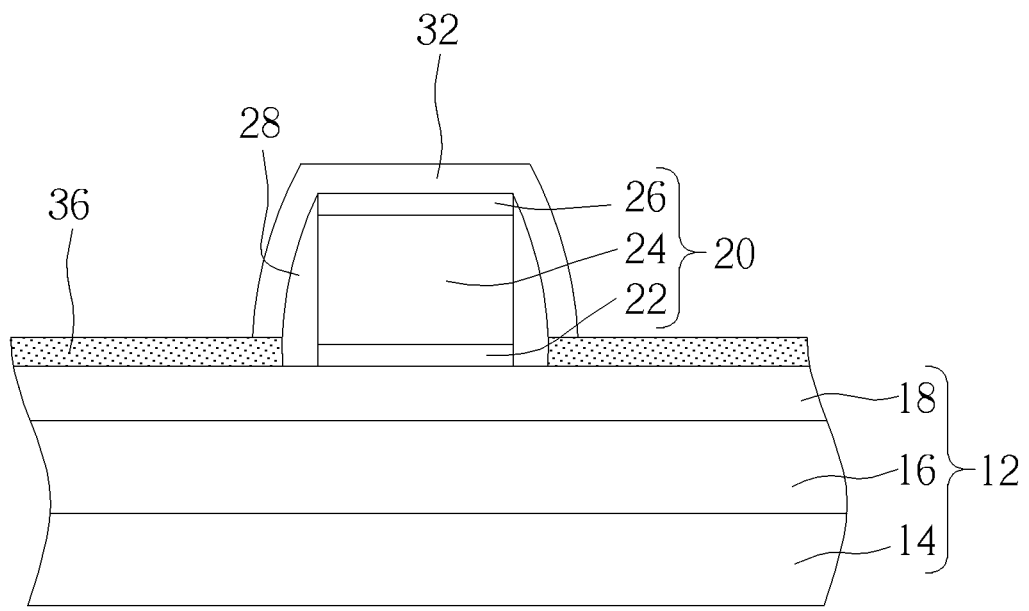
FIG. 8 illustrates cross-section views of FIG. 7 along the sectional line EE' and sectional line FF'.
Figure 8:
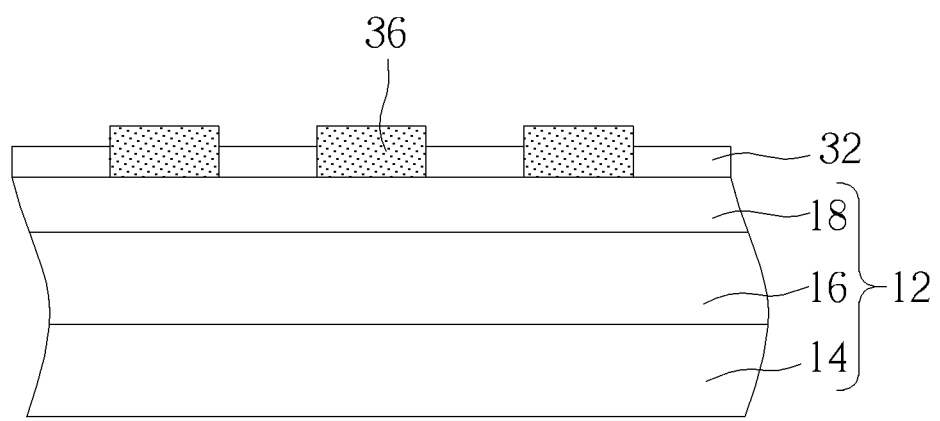

Next, referring to FIGS. 7-8, FIG. 7 illustrates a 3-dimensional view for fabricating the semiconductor device following FIG. 5, the top portion of FIG. 8 illustrates a cross-section view of FIG. 7 along the sectional line EE' and the bottom portion of FIG. 8 illustrates a cross-section view of FIG. 7 along the sectional line FF'. As shown in FIGS. 7-8, a selective epitaxial growth process is then conducted to form a plurality of raised epitaxial layers 36 in the trenches 34. Specifically, the raised epitaxial layers 36 are formed on exposed surface of the second semiconductor layer 18 and filled into the trenches 34 completely according to the shape of the trenches 34. If viewing from the 3-dimensional view of FIG. 7, the raised epitaxial layers 36 are preferably multiple rectangular shaped raised epitaxial layers 36 extending along two sides of the gate structure 20. If viewing from another perspective, the gate structure 20 is disposed on the substrate 12 or second semiconductor layer 18 along a first direction D1 and the raised epitaxial layers 36 are elongated along a second direction D2 adjacent to two sides of the gate structure 20, in which the first direction D1 and second direction D2 are approximately 90 degrees.

Viewing from the bottom portion of FIG. 8, it should be noted that even though the top surface of the raised epitaxial layers 36 is even with the top surface of the patterned hard mask 32, it would be also desirable to control the height of the raised epitaxial layers 36 so that the top surface of the raised epitaxial layers 36 is slightly higher than the top surface of the patterned hard mask 32, which is also within the scope of the present invention. In this embodiment, the raised epitaxial layers 36 could be made of material including but not limited to for example SiGe, SiC, or SiP, and according to an embodiment of the present invention, a selective in-situ doping process could be conducted during the formation of raised epitaxial layers 36 to form a lightly doped drain.

Figure 9:
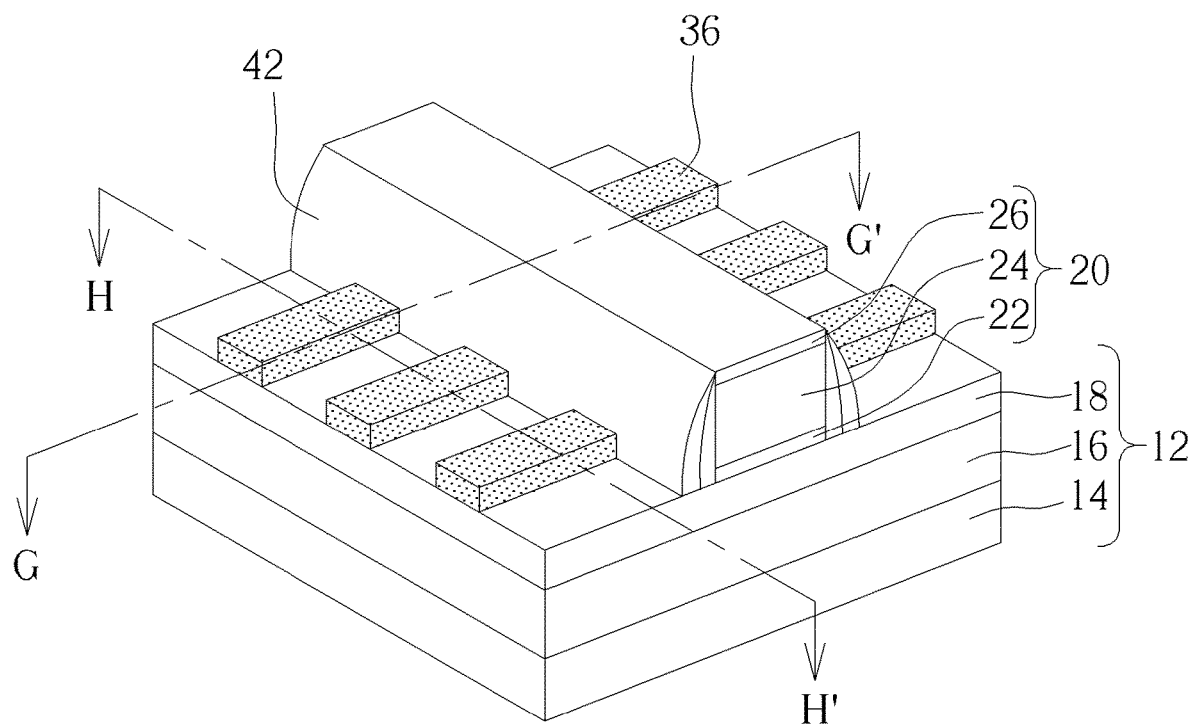
FIG. 9 illustrates a 3-dimensional view for fabricating the semiconductor device following FIG. 7.
Figure 10:
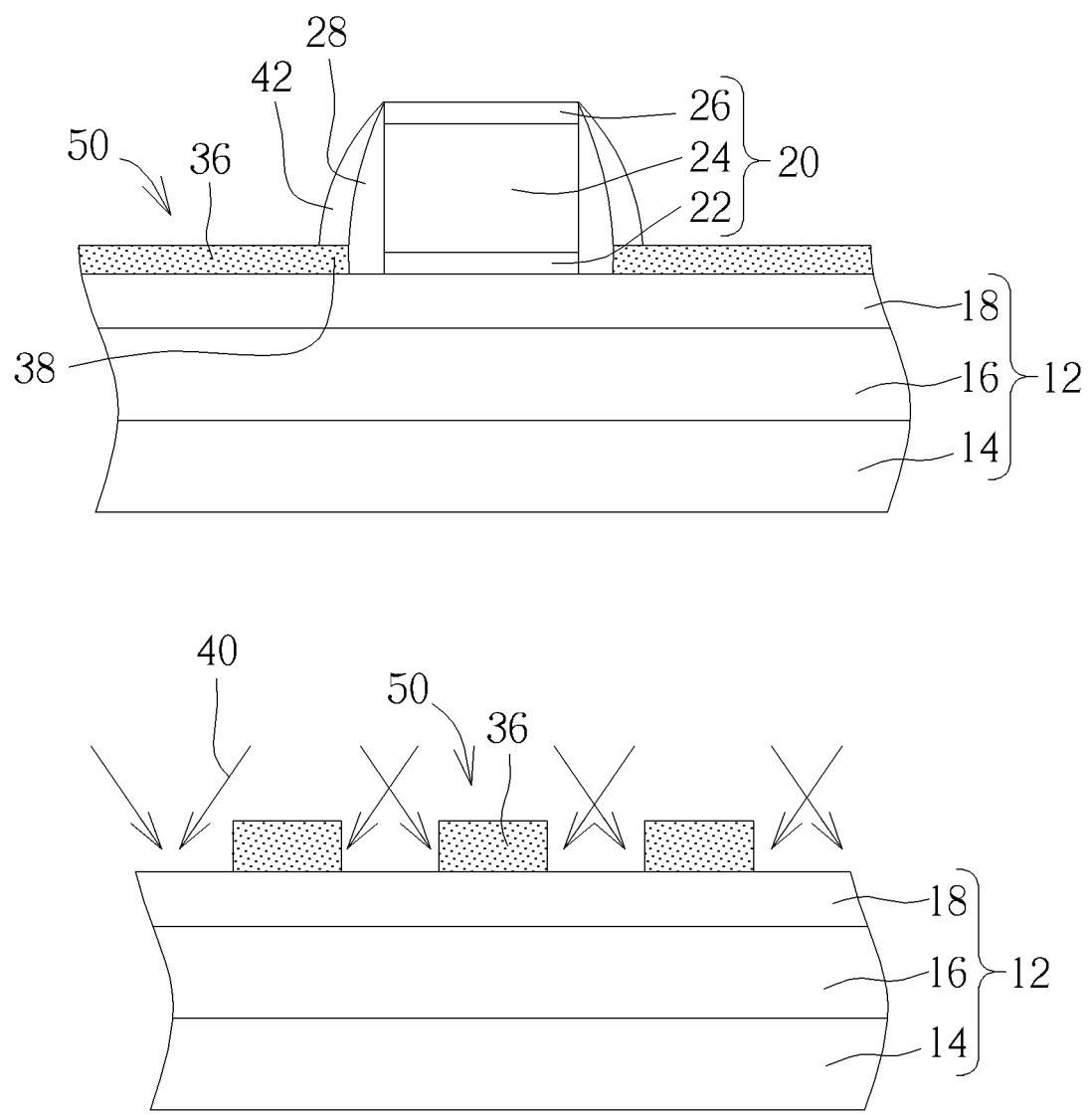
FIG. 10 illustrates cross-section views of FIG. 9 along the sectional line GG' and sectional line HH'.

Next, referring to FIGS. 9-10, FIG. 9 illustrates a 3-dimensional view for fabricating the semiconductor device following FIG. 7, the top portion of FIG. 10 illustrates a cross-section view of FIG. 9 along the sectional line GG' and the bottom portion of FIG. 10 illustrates a cross-section view of FIG. 9 along the sectional line HH'. As shown in FIGS. 9-10, the patterned hard mask 32 is then removed completely to expose the surface of the second semiconductor layer 18 adjacent to two sides of the raised epitaxial layers 36, and an ion implantation process is conducted by using the gate structure 20 and first spacer 28 as mask to implant ions into the raised epitaxial layers 36 for forming a lightly doped drain 38. It should be noted that the ion implantation process conducted in this embodiment could include a tilted angle ion implantation process 40, and the energy of the ion implantation process could also be adjusted so that the ions could be implanted only into the raised epitaxial layers 36 or into both the raised epitaxial layer 36 and downward into part of the second semiconductor layer 18, which are all within the scope of the present invention. Moreover, it should be noted that instead of forming the lightly doped drain 38 after the patterned hard mask 32 is formed as disclosed in this embodiment, it would also be desirable to form the lightly doped drain before the hard mask 30 is formed in FIG. 3 or before the patterned hard mask 32 is formed in FIG. 5, which are all within the scope of the present invention.

Next, a second spacer 42 is formed adjacent to the first spacer 28 and on the raised epitaxial layers 36. In this embodiment, the second spacer 42 and the first spacer 28 could be made of same material or different material, in which the second spacer 42 is preferably a single spacer and could be selected from the group consisting of $SiO_2$, SiN, SiON, and SiCN, but not limited thereto. Similar to the first spacer 28, the second spacer 42 could also be a composite spacer depending on the demand of the product. For instance, the second spacer 42 could further include a first sub-spacer (not shown) and a second sub-spacer (not shown), in which a cross-section of either one of the first sub-spacer or the second sub-spacer could be L-shaped or I-shaped, the first sub-spacer and the second sub-spacer could be made of same material or different material, and either one of the first sub-spacer or the second sub-spacer could be selected from the group consisting of $SiO_2$, SiN, SiON, and SiCN. Next, another ion implantation process could be conducted selectively to form a source/drain region in the raised epitaxial layers 36 or raised epitaxial layers 36 and second semiconductor layer 18 adjacent to two sides of the second spacer 42.

Figure 11:
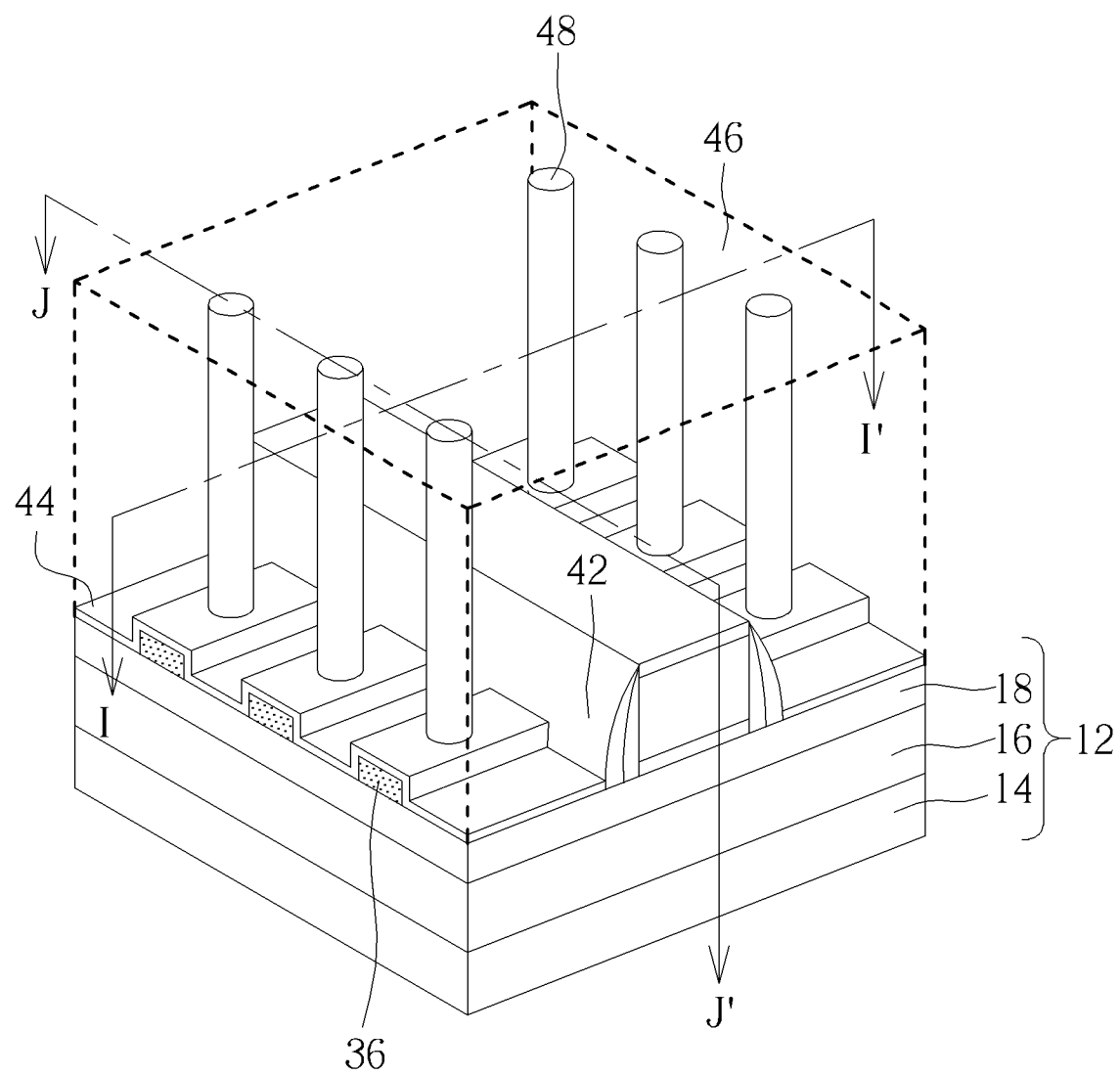
FIG. 11 illustrates a 3-dimensional view for fabricating the semiconductor device following FIG. 9.
Figure 12:
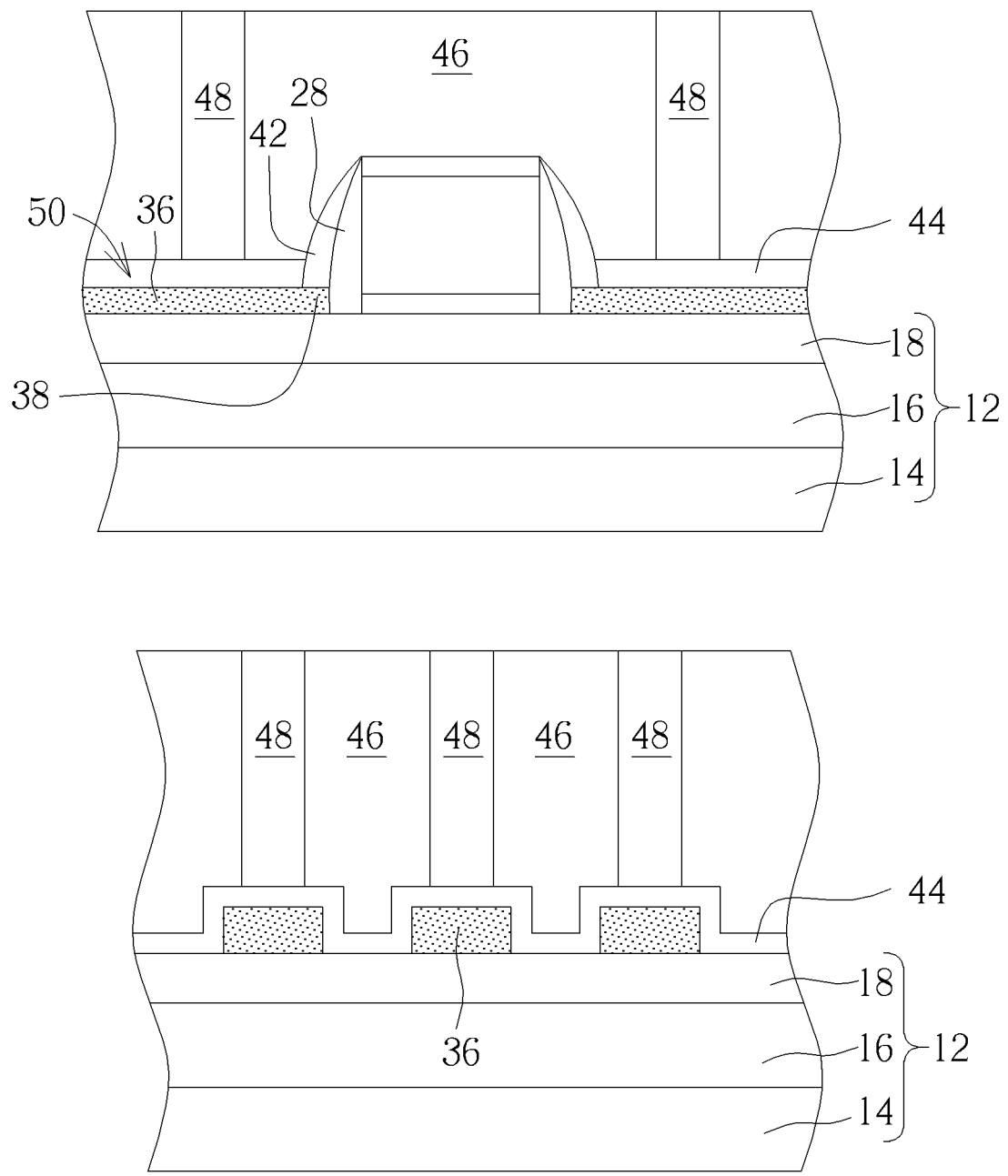
FIG. 12 illustrates cross-section views of FIG. 11 along the sectional line II' and sectional line JJ'.

Next, referring to FIGS. 11-12, FIG. 11 illustrates a 3-dimensional view for fabricating the semiconductor device following FIG. 9, the top portion of FIG. 12 illustrates a cross-section view of FIG. 11 along the sectional line II' and the bottom portion of FIG. 12 illustrate a cross-section view of FIG. 11 along the sectional line JJ'. As shown in FIGS. 11-12, a salicide process is then conducted by first forming a metal layer (not shown) on the surface of the second semiconductor layer 18, the raised epitaxial layers 36, and the gate structure 20, in which the metal layer could be selected from a group consisting of tungsten, cobalt, titanium, nickel, platinum, palladium, molybdenum, or alloy thereof. Next, a thermal treatment, such as a rapid thermal anneal (RTA) process is conducted to form a silicide layer 44 on the raised epitaxial layers 36 and second semiconductor layer 18 not covered by the raised epitaxial layers 36. After the rapid thermal anneal process, an etching process is performed by utilizing a wet etching mixture including but not limited to for example ammonia, hydrogen peroxide, hydrochloric acid, sulfuric acid, nitric acid, acetic acid, or combination thereof to remove un-reacted metal layer. It should be noted that since the rectangular raised epitaxial layers 36 are elongated adjacent to two sides of the gate structure 20 on the substrate 12, the silicide layer 44 would be formed not only on the top surface of the second semiconductor layer 18 but also covering the top surface and sidewalls of the raised epitaxial layers 36 at the same time thereby constituting a continuous step-shaped profile.

According to an embodiment of the present invention, it would also be desirable to conduct another epitaxial growth process after the source/drain region 50 is formed in FIG. 9 to form an epitaxial layer (not shown) on the surface of the second semiconductor layer 18 and the raised epitaxial layers 36, in which the epitaxial layer could be made of silicon, germanium, silicon germanium, or combination thereof. In other words, the epitaxial layer would preferably be formed on all of the exposed top surface of the second semiconductor layer 18 and the top surface and sidewalls of the raised epitaxial layers 36 so that none of the top surface of the second semiconductor layer 18 is exposed. If viewing from a cross-sectional perspective, the additionally formed epitaxial layer would demonstrate similar continuous step-shaped profile as the silicide layer 44 shown in FIG. 11. After the additional epitaxial layer is formed, a salicide process conducted in FIGS. 11-12 could be carried out to form a silicide layer on top of the additional epitaxial layer. Since the silicide layer is formed along the profile of the epitaxial layer, the silicide layer formed on the surface of the additional epitaxial layer would also reveal similar continuous step-shaped profile.

Next, a contact etch stop layer (CESL) (not shown) made of silicon nitride could be formed on the substrate 12 to cover the gate structure 20, and an interlayer dielectric (ILD) layer 46 is formed on the CESL.

Next, a contact plug formation could be conducted by removing part of the ILD layer 46 through etching process to form a plurality of contact holes (not shown) exposing part of the silicide layer 44 adjacent to two sides of the gate structure 20, and conductive material is deposited into the contact holes to form contact plugs 48 electrically connected to the raised epitaxial layers 36 and/or source/drain region 50. In this embodiment, the formation of the contact plugs 48 could be accomplished by sequentially depositing a barrier layer (not shown) and a metal layer (not shown) into the contact holes and then conducting a planarizing process such as chemical mechanical polishing (CMP) to remove part of the metal layer, part of the barrier layer, and even part of the ILD layer 46 for forming contact plugs 48 in the contact holes, in which the top surfaces of the contact plugs 48 and the ILD layer 46 are coplanar. In this embodiment, the barrier layer is preferably selected from the group consisting of Ti, Ta, TiN, TaN, and WN, and the metal layer is selected from the group consisting of Al, Ti, Ta, Co, Nb, Mo, and Cu. This completes the fabrication of a semiconductor device according to a preferred embodiment of the present invention.

It should be noted that even though multiple contact plugs are formed adjacent to two sides of the gate structure 20 to electrically connect the raised epitaxial layers 36 in the aforementioned embodiment, it would also be desirable to form only a single contact plug or slot contact on each side of the gate structure 20 through a slot contact fabrication process according to an embodiment of the present invention. Specifically, since the slot contact plugs adjacent to two sides of the gate structure 20 would cross multiple raised epitaxial layers 36 at the same time, the bottom of the slot contact plugs would preferably contact the silicide layer 44 directly on top of the raised epitaxial layers 36 and the silicide layer 44 directly on top of the second semiconductor layer 18 at the same time so that the bottom of the slot contacts would reveal step-shaped profile as the aforementioned silicide layer 44.

Figure 13:
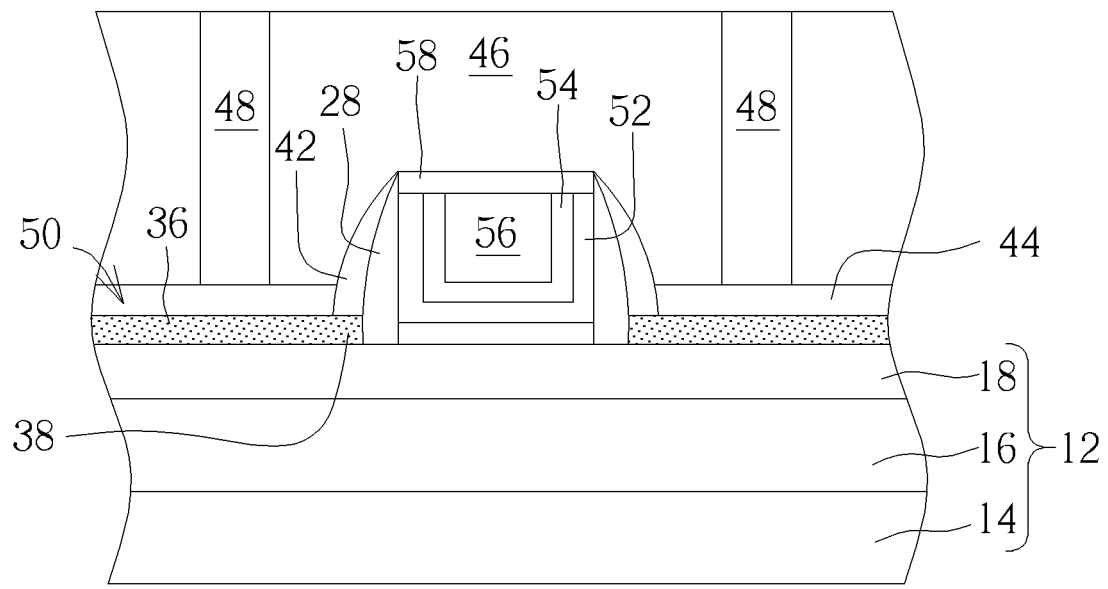
FIG. 13 illustrates a cross-section view of a semiconductor device according to an embodiment of the present invention.

Moreover, in addition to using gate first process conducted for fabricating semiconductor device as disclosed in the aforementioned embodiment, it would also be desirable to apply the aforementioned process to a gate last process. For instance, if a high-k last process from gate last process were employed as shown in FIG. 13, it would be desirable to conduct a planarizing process such as CMP process after forming the ILD layer 46 in FIGS. 11-12 to remove part of the ILD layer 46 and hard mask 26 for exposing the gate material layer 24 made of polysilicon so that the top surfaces of the gate material layer 24 and ILD layer 46 are coplanar.

Next, a replacement metal gate (RMG) process is conducted to transform the gate structure 20 into metal gate. The RMG process could be accomplished by first performing a selective dry etching or wet etching process, such as using etchants including but not limited to for example ammonium hydroxide ($NH_4OH$) or tetramethylammonium hydroxide (TMAH) to remove the gate material layer 24 from gate structure 20 for forming a recess (not shown) in the ILD layer 46. Next, a high-k dielectric layer 52, a work function metal layer 54, and a low resistance metal layer 56 are formed in the recess, and a planarizing process such as CMP is conducted to remove part of low resistance metal layer 56, part of work function metal layer 54, and part of high-k dielectric layer 52 to form a metal gate. In this embodiment, the gate structure 20 or metal gate fabricated through high-k last process of a gate last process preferably includes an interfacial layer or gate dielectric layer 22, a U-shaped high-k dielectric layer 52, a U-shaped work function metal layer 54, and a low resistance metal layer 56.

In this embodiment, the high-k dielectric layer 52 is preferably selected from dielectric materials having dielectric constant (k value) larger than 4. For instance, the high-k dielectric layer 52 may be selected from hafnium oxide ($HfO_2$), hafnium silicon oxide ($HfSiO_4$), hafnium silicon oxynitride (HfSiON), aluminum oxide ($Al_2O_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 54 is formed for tuning the work function of the metal gate in accordance with the conductivity of the device. For an NMOS transistor, the work function metal layer 54 having a work function ranging between 3.9 eV and 4.3 eV may include titanium aluminide (TiAl), zirconium aluminide (ZrAl), tungstenaluminide (WAl), tantalumaluminide (TaAl), hafnium aluminide (HfAl), or titanium aluminum carbide (TiAlC), but it is not limited thereto. For a PMOS transistor, the work function metal layer 54 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 54 and the low resistance metal layer 56, in which the material of the barrier layer may include titanium (Ti), titanium nitride (TiN), tantalum (Ta) or tantalum nitride (TaN). Furthermore, the material of the low-resistance metal layer 56 may include copper (Cu), aluminum (Al), titanium aluminum (TiAl), cobalt tungsten phosphide (CoWP) or any combination thereof.

Next, part of the high-k dielectric layer 52, part of the work function metal layer 54, and part of the low resistance metal layer 56 are removed to form a recess (not shown), and a hard mask 58 is formed in the recess so that the top surfaces of the hard mask 58 and ILD layer 46 are coplanar. The hard mask 58 could be selected from the group consisting of silicon oxide, silicon nitride, silicon oxynitride, and silicon carbon nitride. Lastly, a contact formation could be conducted as disclosed in the aforementioned embodiment to form contact plugs 48 in the ILD layer 46 for electrically connecting the raised epitaxial layer 36 or source/drain region 50.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate;
    forming a gate structure extending along a first direction on the substrate;
    forming a first spacer adjacent to the gate structure;
    forming a hard mask on the substrate, the first spacer, and the gate structure;
    removing a part of the hard mask to form a patterned hard mask extending along a second direction and trenches extending along the second direction between the patterned hard mask and exposing the substrate, the first spacer, and a top surface of the gate structure, wherein the first direction is perpendicular to the second direction and a bottom surface of the trenches is even with a bottom surface of the gate structure; and
    forming raised epitaxial layers in the trenches.

2. The method of claim 1, wherein the substrate comprises:
    a first semiconductor layer;
    an insulating layer on the first semiconductor layer; and
    a second semiconductor layer on the insulating layer.

3. The method of claim 2, wherein a sidewall of the raised epitaxial layers and a top surface of the second semiconductor layer comprise a right angle.

4. The method of claim 2, further comprising forming a first spacer adjacent to the gate structure before forming the hard mask.

5. The method of claim 4, further comprising:
    removing the hard mask after forming the raised epitaxial layers;
    implanting dopants into the raised epitaxial layers to form a lightly doped drain; and
    forming a second spacer adjacent to the first spacer and on the raised epitaxial layers.

6. The method of claim 5, further comprising implanting dopants into the raised epitaxial layers and the second semiconductor layer to form the lightly doped drain.

7. The method of claim 1, further comprising forming a silicide layer on a top surface and sidewalls of the raised epitaxial layers.

8. The method of claim 1, further comprising forming a silicide layer on a top surface and sidewalls of the raised epitaxial layers and a top surface of the substrate.

9. The method of claim 1, wherein the bottom surfaces of the raised epitaxial layers and the gate structure are coplanar.

10. The method of claim 1, wherein the raised epitaxial layers are elongated along a second direction adjacent to two sides of the gate structure.

* * * * *